(12) United States Patent
Yoon et al.

(10) Patent No.: US 8,189,131 B2
(45) Date of Patent: May 29, 2012

(54) THIN-FILM TRANSISTOR, SUBSTRATE AND DISPLAY DEVICE EACH HAVING THE THIN-FILM TRANSISTOR, AND METHOD OF MANUFACTURING THE THIN-FILM TRANSISTOR

(75) Inventors: Kap-Soo Yoon, Seoul (KR); Sung-Hoon Yang, Seoul (KR); Sung-Ryul Kim, Cheonan-si (KR); Hwa-Yeul Oh, Seoul (KR); Jae-Ho Choi, Seoul (KR); Yong-Mo Choi, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 859 days.

(21) Appl. No.: 12/188,956

(22) Filed: Aug. 8, 2008

(65) Prior Publication Data

US 2009/0152553 A1    Jun. 18, 2009

(30) Foreign Application Priority Data

Dec. 18, 2007    (KR) ........................ 10-2007-0133048

(51) Int. Cl.
*G02F 1/136*    (2006.01)

(52) U.S. Cl. .......................................... 349/43; 257/55

(58) Field of Classification Search .................... 349/41, 349/42, 43, 138, 140; 257/57, E29.004, E21.414, 257/59, 55, 52; 438/158
See application file for complete search history.

(56) References Cited

U.S. PATENT DOCUMENTS

| | | | | |
|---|---|---|---|---|
| 5,273,919 | A | * | 12/1993 | Sano et al. ..................... 438/158 |
| 5,496,752 | A | * | 3/1996 | Nasu et al. ...................... 438/30 |
| 5,567,956 | A | * | 10/1996 | Yamanobe et al. ............. 257/55 |
| 5,714,766 | A | * | 2/1998 | Chen et al. ....................... 257/17 |
| 6,674,495 | B1 | * | 1/2004 | Hong et al. ...................... 349/43 |
| 7,224,013 | B2 | * | 5/2007 | Herner et al. ................. 257/296 |
| 7,230,267 | B2 | * | 6/2007 | Nagayama et al. ............. 257/40 |
| 7,674,650 | B2 | * | 3/2010 | Akimoto et al. .............. 438/104 |
| 2007/0090352 | A1 | * | 4/2007 | Ahn et al. ....................... 257/40 |

* cited by examiner

*Primary Examiner* — Thoi Duong
(74) *Attorney, Agent, or Firm* — Innovation Consel LLP

(57) ABSTRACT

A thin-film transistor (TFT) includes a gate electrode, a semiconductor pattern, a source electrode, and a drain electrode. The semiconductor pattern includes an active layer being overlapped with the gate electrode and a low band gap portion having a lower energy band gap than the active layer. The source and drain electrodes are spaced apart from each other to be overlapped with the semiconductor pattern. Therefore, the semiconductor pattern includes a low band gap portion having a lower energy band gap than the active layer, so that electron mobility may be increased in a channel formed along the low band gap portion so that electric characteristics of the TFT may be enhanced.

21 Claims, 7 Drawing Sheets

THIN-FILM TRANSISTOR, SUBSTRATE AND DISPLAY DEVICE EACH HAVING THE THIN-FILM TRANSISTOR, AND METHOD OF MANUFACTURING THE THIN-FILM TRANSISTOR

CROSS-REFERENCE TO RELATED APPLICATIONS

This application claims priority under 35 U.S.C. §119 to Korean Patent Application No. 2007-133048, filed on Dec. 18, 2007 in the Korean Intellectual Property Office (KIPO), the contents of which are herein incorporated by reference in their entirety.

BACKGROUND OF THE INVENTION

1. Field of the Invention

The present invention relates to a thin-film transistor (TFT), a method of manufacturing the TFT, a TFT substrate having the TFT, and a display device having the TFT substrate. More particularly, the present invention relates to a TFT adapted to a liquid crystal display (LCD) device, a method of manufacturing the TFT, a TFT substrate having the TFT and a display device having the TFT substrate.

2. Description of the Related Art

Generally, a liquid crystal display (LCD) device includes an LCD panel that displays an image using a light-transmitting ratio of liquid crystal molecules, and a backlight assembly disposed below the LCD panel to provide the LCD panel with light.

The LCD panel includes a first substrate, a second substrate facing the first substrate, and a liquid crystal layer interposed between the first and second substrates. The first substrate includes a plurality of thin-film transistors (TFTs). The TFTs include a plurality of pixel transistors electrically connected to a plurality of pixel electrodes, respectively, and a plurality of driving transistors for controlling the pixel transistors. The second substrate has a plurality of color filters formed in a position corresponding to the pixel electrodes.

Each of the TFTs includes a gate electrode, a gate insulation layer formed on the gate electrode, an active layer formed on the gate insulation layer, and source and drain electrodes that are spaced apart from each other on the active layer.

The active layer may include, in general, an amorphous silicon film, a microcrystalline silicon film and a polycrystalline silicon film.

The amorphous silicon film has a lower electron mobility than the microcrystalline silicon film and the polycrystalline silicon film. Although the polycrystalline silicon film has a higher electron mobility than the amorphous silicon film and the microcrystalline silicon film, a manufacturing process of the polycrystalline silicon film may be complicated.

The microcrystalline silicon film is manufactured by a simpler process than the polycrystalline silicon film. The microcrystalline silicon has a higher electric mobility than the amorphous-silicon film. However, microcrystals are not present at the bottom of the microcrystalline silicon film, and are only present at the top of the microcrystalline silicon film. Therefore, when a voltage is applied to the gate electrode to form a channel in a lower portion of the microcrystalline silicon film, electron mobility corresponding to the channel may have a relatively lower value than expected.

SUMMARY OF THE INVENTION

The present invention provides a thin-film transistor (TFT) having enhanced electric characteristics.

The present invention also provides a method of manufacturing the TFT.

The present invention also provides a TFT substrate having the TFT.

In addition, the present invention provides a display device having the TFT substrate.

In one aspect of the present invention, a TFT includes a gate electrode, a semiconductor pattern, a source electrode, and a drain electrode. The semiconductor pattern includes an active layer being overlapped with the gate electrode and a low band gap portion having a lower energy band gap than the active layer. The source and drain electrodes are spaced apart from each other to be overlapped with the semiconductor pattern.

In one embodiment, the TFT may further include a gate insulation layer formed between the gate electrode and the low band gap portion.

In an embodiment, the active layer may include amorphous silicon or microcrystalline silicon. The low band gap portion may include a plurality of nanocrystals that are spaced apart from each other between the gate insulation layer and the active layer. The nanocrystals may include silicon or a silicon germanium ($Si_xGe_{1-x}$, wherein 0<x<1). The nanocrystals may be spaced apart from each other in a plane direction that is parallel with a surface of the gate insulation layer to have a shape of two-dimensional electron gas. An energy band gap of the low band gap portion may be about 0.9 eV to about 1.8 eV.

In an embodiment, the low band gap portion may include a low band gap layer formed between the gate insulation layer and the active layer in a thin-film shape. The low band gap layer may include a silicon germanium ($Si_xGe_{1-x}$, wherein 0<x<1). An energy band gap of the low band gap layer may be about 0.9 eV to about 1.8 eV.

In an embodiment, the semiconductor pattern may further include a buffer layer between the gate insulation layer and the low band gap portion, wherein the buffer layer and the active layer are formed from a same material.

In an embodiment, the semiconductor pattern may further include an ohmic contact layer formed between the source electrode and the active layer, and between the drain electrode and the active layer.

In another aspect of the present invention, there is provided a method of manufacturing a TFT. In the method, a gate electrode is formed. A semiconductor pattern including an active layer and a low energy band gap portion are formed. The active layer is overlapped with the gate electrode. The low band gap portion has a lower energy band gap than the active layer. A source electrode and a drain electrode are formed spaced apart from each other to be overlapped with the semiconductor pattern.

In an embodiment, a gate insulation layer may be formed between the gate electrode and the low band gap portion.

In an embodiment, a buffer layer may be formed between the gate insulation layer and the low band gap portion. Here, the buffer layer and the active layer may be formed from a same material.

In an embodiment of forming the semiconductor pattern, the low band gap portion may be formed on the gate insulation layer, and then the active layer may be formed on the low band gap portion.

In an embodiment of forming the low band gap portion, silicon or germanium may be deposited on the gate insulation layer to form a plurality of nanocrystals that are spaced apart from each other. Alternatively, forming the low band gap portion may include depositing silicon or germanium on the gate insulation layer to form a low band gap layer of a thin-film shape.

In still another aspect of the present invention, a TFT substrate includes a base substrate, a plurality of TFTs, a passivation layer and a plurality of pixel electrodes. The TFTs include a gate electrode, a semiconductor pattern comprising an active layer being overlapped with the gate electrode and a low band gap portion having a lower energy band gap than the active layer, and a source electrode and a drain electrode that are spaced apart from each other to be overlapped with the semiconductor pattern. The passivation layer covers the TFT to protect the TFT. The pixel electrodes are formed on the passivation layer to be electrically connected to the TFT through a plurality of contact holes of the passivation layer.

In an embodiment, a portion of the TFTs may be formed in a display area of the base substrate to be electrically connected to the pixel electrodes, respectively, and another portion of the TFT may be formed in a peripheral area of the base substrate to control the TFT formed in the display area.

In still another aspect of the present invention, a display device includes a TFT substrate, an opposite substrate and a liquid crystal layer. The opposite substrate is opposite to the TFT substrate. The liquid crystal layer is disposed between the TFT substrate and the opposite substrate. The TFT substrate includes a base substrate, a plurality of TFTs, a passivation layer and a plurality of pixel electrodes. The TFTs include a gate electrode, a semiconductor pattern comprising an active layer being overlapped with the gate electrode and a low band gap portion having a lower energy band gap than the active layer, and a source electrode and a drain electrode that are spaced apart from each other to be overlapped with the semiconductor pattern. The passivation layer covers the TFT to protect the TFT. The pixel electrodes are formed on the passivation layer to be electrically connected to the TFT through a plurality of contact holes of the passivation layer.

According to the present invention, a semiconductor pattern includes a low band gap portion having a lower energy band gap than the active layer, so that electron mobility may be increased in a channel formed along the low band gap portion so that electric characteristics of the TFT may be enhanced.

BRIEF DESCRIPTION OF THE DRAWINGS

The present invention will become readily apparent by reference to the following detailed description when considered in conjunction with the accompanying drawings wherein.

DESCRIPTION OF THE EMBODIMENTS

Figure 1:
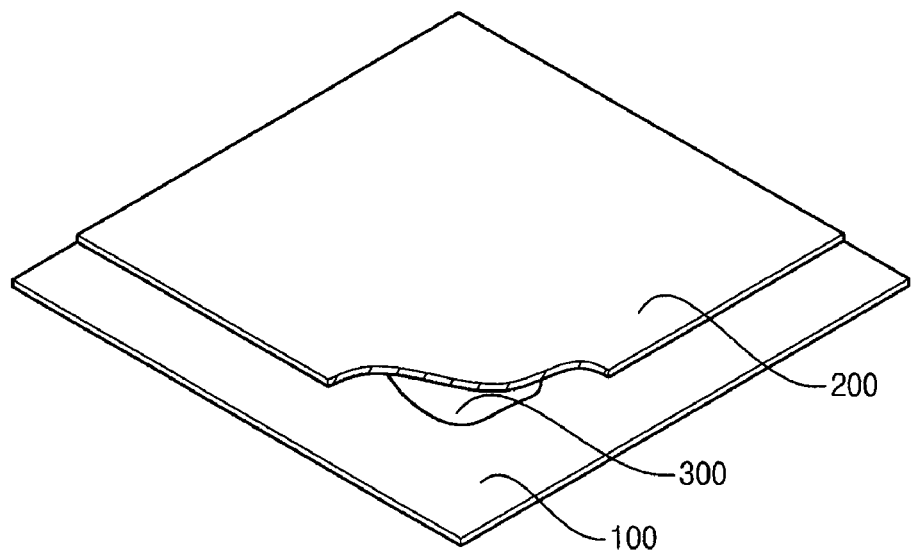
FIG. 1 is a perspective view illustrating a display device according to an embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is a perspective view illustrating a display device according to one embodiment of the present invention.

Referring to FIG. 1, a display device according to one embodiment of the present invention includes a thin-film transistor (TFT) substrate 100, an opposite substrate 200 and a liquid crystal layer 300, and displays an image using lights.

The TFT substrate 100 includes a plurality of TFTs and a plurality of pixel electrodes electrically connected to a portion of the TFT.

The opposite substrate 200 is disposed to face the TFT substrate 100. The opposite substrate 200 may include a plurality of color filters formed in a position corresponding to the pixel electrodes, and a common electrode formed thereon. The color filters may include a plurality of red color filters, a plurality of green color filters and a plurality of blue color filters. For one example, the color filters are formed on the opposite substrate 200. For another example, the color filters are formed on the TFT substrate 100.

The liquid crystal layer 300 is interposed between the TFT substrate 100 and the opposite substrate 200. Therefore, when an electric field is applied to the liquid crystal layer 300, an arrangement of liquid crystal molecules of the liquid crystal layer 300 is altered to change optical transmissivity, so that an image is displayed.

The display device may further include a backlight assembly (not shown) disposed below the TFT substrate 100 to provide the TFT substrate 100 with lights.

Figure 2:
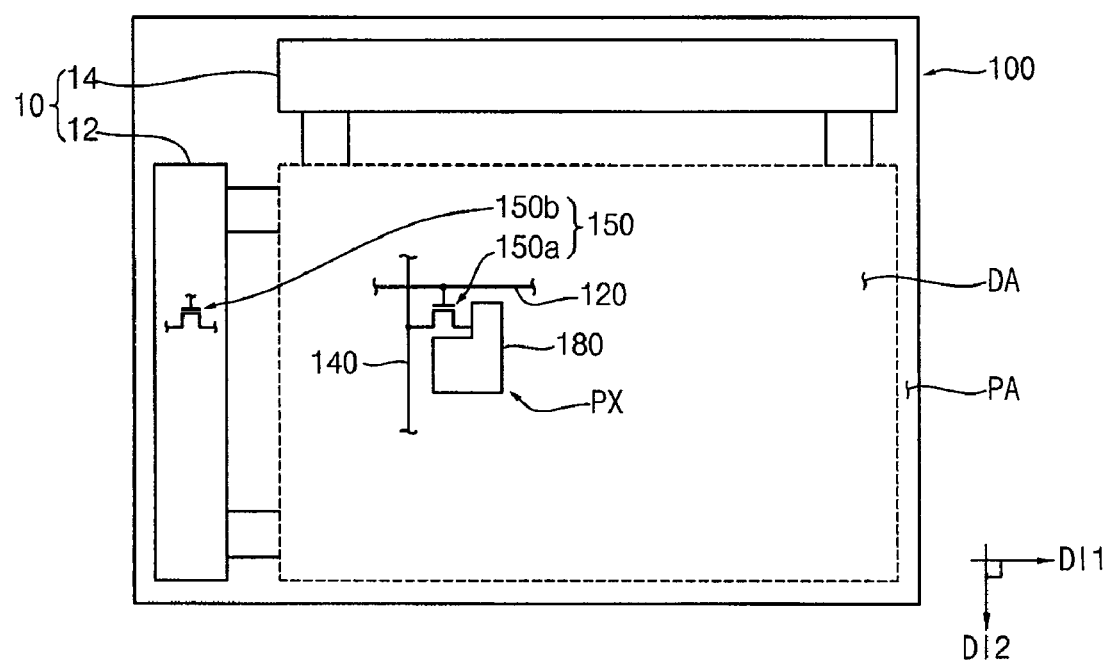
FIG. 2 is a plan view schematically illustrating a portion of the thin-film transistor (TFT) substrate of FIG. 1.

FIG. 2 is a plan view schematically illustrating a portion of the TFT substrate of FIG. 1.

Referring to FIG. 2, the TFT substrate 100 includes a display area DA displaying an image and a peripheral area PA that is a peripheral area of the display area DA.

A plurality of unit pixels PX for displaying an image is formed in the display area DA, and a driving circuit 10 for controlling the unit pixels PX is formed in the peripheral area PA. The driving circuit 10 may include a gate driving portion 12 generating a gate signal and a data driving portion 14 generating a data signal.

The TFTs 150 formed in the TFT substrate 100 may include a plurality of pixel transistors 150a formed in the display area DA and a plurality of driving transistors 150b formed in the peripheral area PA.

The pixel transistors 150a are electrically connected to the pixel electrodes 180 formed in the unit pixels PX, respectively. The driving transistors 150b may be included in the gate driving portion 12 or the data driving portion 14. Alternatively, the driving transistors 150b are included in the gate driving portion 12, and the data driving portion 14 may be disposed in a portion of the peripheral area PA in an additional chip type.

The pixel transistors 150a and the driving transistors 150b are manufactured through the same process, so that the pixel and driving transistors 150a and 150b may have the same structure and electrical characteristics. That is, characteristics of the pixel transistors 150a are the same as those of the driving transistors 150b, except that the pixel transistors 150a are formed in the display area DA to be electrically connected to the pixel electrodes 180, respectively, and the driving transistors 150b are formed in the peripheral area PA.

Accordingly, when characteristics for the TFTs 150 are described, the pixel transistors 150a will be described, and a description of the driving transistors 150b will be omitted.

Figure 3:
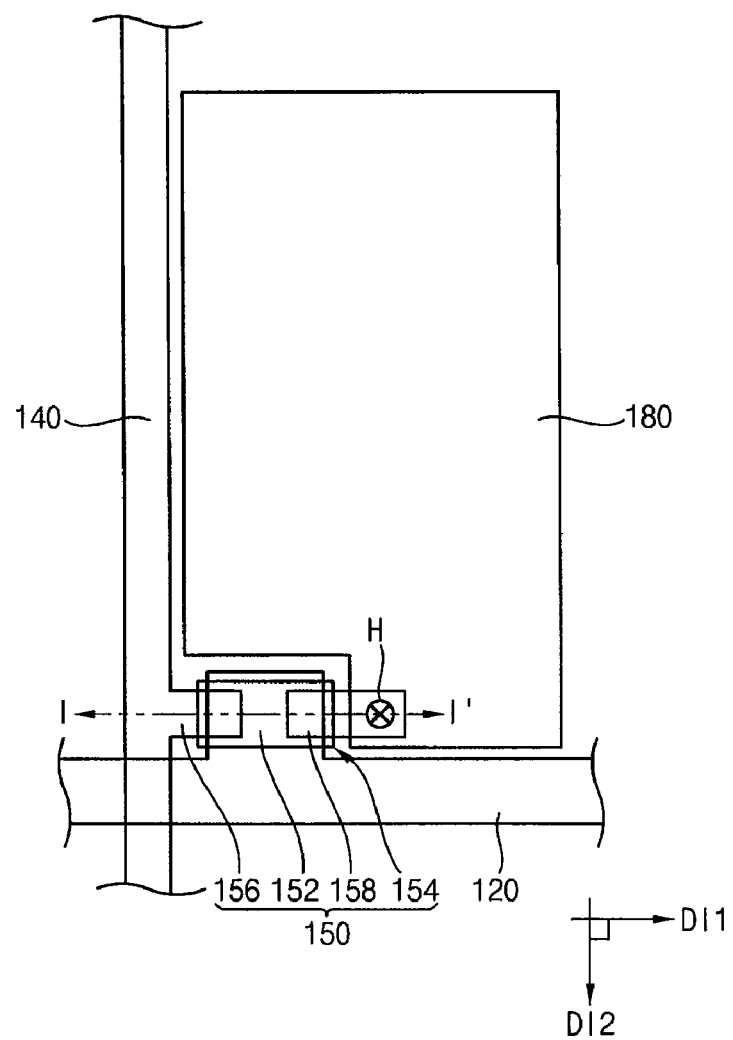
FIG. 3 is an enlarged plan view illustrating a unit pixel of the TFT substrate of FIG. 2.
Figure 4:
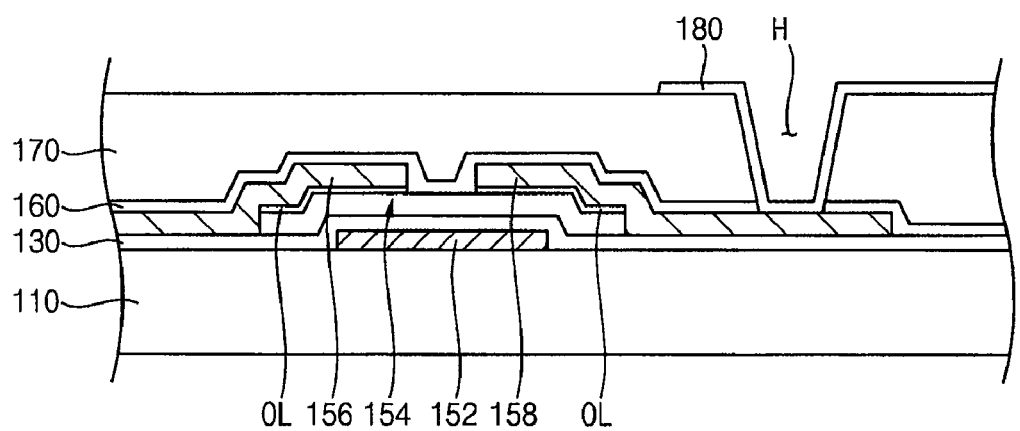
FIG. 4 is a cross-sectional view taken along a line I-I' of FIG. 3.

FIG. 3 is an enlarged plan view illustrating a unit pixel of the TFT substrate of FIG. 2. FIG. 4 is a cross-sectional view taken along a line I-I' of FIG. 3.

Referring to FIGS. 2 to 4, the TFT substrate 100 includes the TFTs 150 and the pixel electrodes 180. The TFT substrate 100 further includes a base substrate 110, a plurality of gate lines 120, a gate insulation layer 130, a plurality of data lines 140 and a passivation layer.

The base substrate 110 has a plate shape. The base substrate 110 includes a transparent material such as glass, quartz, synthetic resin, etc.

The gate lines 120 are formed on the base substrate 110 along a first direction Dl1. The gate lines 120 are extended along the first direction D1. The gate lines 120 are disposed along a second direction Dl2 crossing the first direction Dl1 in parallel with each other. The first and second directions Dl1 and Dl2 are substantially perpendicular to each other. The gate lines 120 may include an aluminum (Al) series metal such as aluminum, aluminum alloy, etc., a molybdenum (Mo) series metal such as molybdenum, molybdenum alloy, etc., and a metal including chromium (Cr), tantalum (Ta), titanium (Ti), tungsten (W), silver (Ag), copper (Cu), an alloy thereof, etc. The gate lines 120 may include a single layer structure or a multilayer structure. For one example, the gate lines 120 may include molybdenum (Mo), molybdenum alloy such as a molybdenum-tantalum (MoTa) and a molybdenum-tungsten (MoW), and an aluminum alloy such as an aluminum-nickel (AlNi). In another example, the gate lines 120 may include molybdenum (Mo) and aluminum (Al) that are sequentially formed on the molybdenum (Mo). For still another example, the data line 140 may include titanium (Ti) and aluminum (Al) that are sequentially formed on the titanium (Ti). In still another example, the data line 140 may include molybdenum (Mo), aluminum (Al) that are sequentially formed on the molybdenum (Mo), and molybdenum (Mo) that is sequentially formed on the aluminum (Al).

The gate insulation layer 130 is formed on the base substrate 110 to cover the gate line 120. The gate insulation layer 130 may include an inorganic insulation. For example, the gate insulation layer 130 includes a silicon nitride layer (SiNx) and a silicon oxide layer (SiOx).

The data lines 140 are formed on the gate insulation layer 110. The data lines 140 are extended along the second direction DI2. The data lines 140 are disposed along the first direction DI1 in parallel with each other. The data line 140 includes an aluminum (Al) series metal such as aluminum, aluminum alloy, etc., a molybdenum (Mo) series metal such as molybdenum, molybdenum alloy, etc., and a metal including chromium (Cr), tantalum (Ta), titanium (Ti), tungsten (W), silver (Ag), copper (Cu), an alloy thereof, etc. The data line 140 may include a conductive layer having a low resistance or a multilayer having a good contact characteristic. In one example, the data line 140 may include molybdenum (Mo), a molybdenum-tantalum (MoTa), a molybdenum-tungsten (MoW) and an aluminum-nickel (AlNi). For another example, the data line 140 may include molybdenum (Mo) and aluminum (Al) that are sequentially formed on the molybdenum (Mo). For still another example, the data line 140 may include titanium (Ti) and aluminum (Al) that are sequentially formed on the titanium (Ti). In still another example, the data line 140 may include molybdenum (Mo), aluminum (Al) that are sequentially formed on the molybdenum (Mo), and molybdenum (Mo) that is sequentially formed on the aluminum (Al).

Each of the TFTs 150 includes a gate electrode 152, a semiconductor pattern 154, a source electrode 156 and a drain electrode 158. Here, each of the TFTs 150 may further include a portion of the gate insulation layer 130.

The gate electrode 152 is extended from the gate line 120 to be formed on the base substrate 110. For example, the gate electrode 152 may be extended from the gate line GL substantially in parallel with the second direction DI2. Alternatively, the gate electrode 152 may be a portion of the gate line 120.

The gate insulation layer 130 is formed on the base substrate 110 to cover the gate line 120 and the gate electrode 152. As a result, a portion of the gate insulation layer 130 is formed on the gate electrode 152.

The semiconductor pattern 154 is formed on the gate insulation layer 130 to be overlapped with the gate electrode 152. A detail description for the semiconductor pattern 154 will be described later.

The source electrode 156 is extended from the data line 140 to be formed on the gate insulation layer 130. For example, the source electrode 156 may be extended from the data line 140 in parallel with the first direction DI1. Alternatively, the source electrode 156 may be a portion of the data line 140. A portion of the source electrode 156 is formed on the semiconductor pattern 154 to be overlapped with the semiconductor pattern 154.

The drain electrode 158 is formed on the gate insulation layer 130 to be spaced apart from the source electrode 156. A portion of the drain electrode 158 is formed on the semiconductor pattern 154 to be overlapped with the semiconductor pattern 154. The drain electrode 158 is formed through the same process for manufacturing the data line 140 and the source electrode 156. A material of the drain electrode 158 is identical to that of the data line 140 and the source electrode 156.

The passivation layer 160 is formed on the gate insulation layer 130 to cover the data lines 140 and the TFTs 150. As a result, the passivation layer 160 may protect the data lines 140 and the TFTs 150. The passivation layer 160 may include silicon nitride (SiNx), silicon oxide (SiOx), etc.

The organic insulation layer 170 is formed on the passivation layer 160. The organic insulation layer 170 may have a thickness of about 2 μm. An upper surface of the organic insulation layer 170 may be substantially parallel with the base substrate 110.

A contact hole H may be formed through the passivation layer 160 and the organic insulation layer 170 to expose a portion of the drain electrode 158.

The pixel electrodes 180 are formed in the unit pixels PX, respectively. The pixel electrodes 180 are electrically connected to the drain electrodes 158 of the TFTs 150, respectively, through the contact holes H. Each of the pixel electrodes 180 may include an optically transparent and electrically conductive material. The pixel electrode 180 may include indium tin oxide (ITO) and indium zinc oxide (IZO).

The TFT 150 that is described in FIGS. 3 and 4 may have a structure of the TFT that is manufactured through five masking process. Alternatively, the TFT 150 may have a structure of the TFT that is manufactured through three masking process or six masking process.

Figure 5:
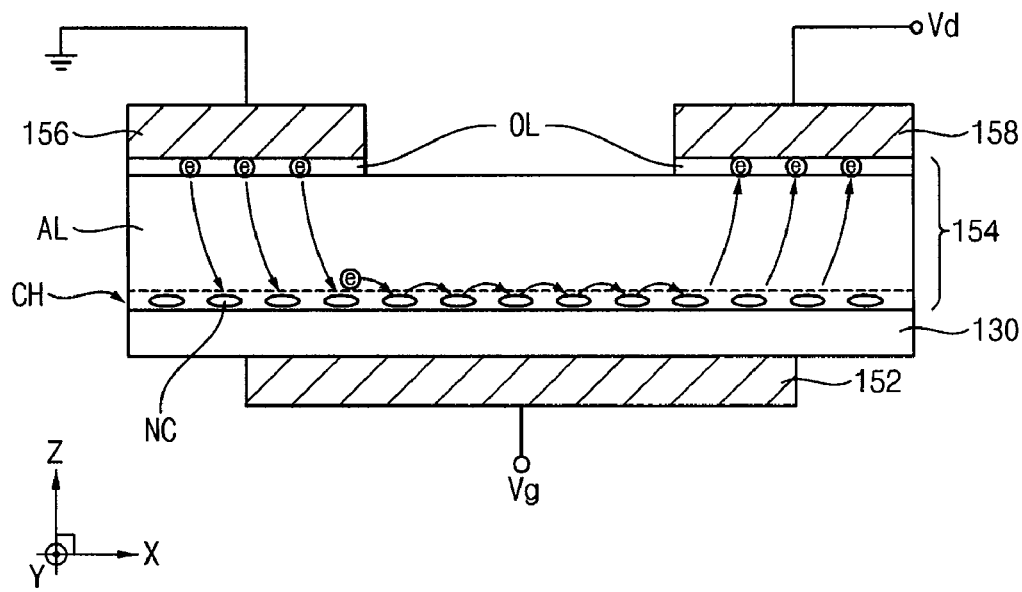
FIG. 5 is a cross-sectional view schematically illustrating the TFT of FIG. 4.
Figure 6:
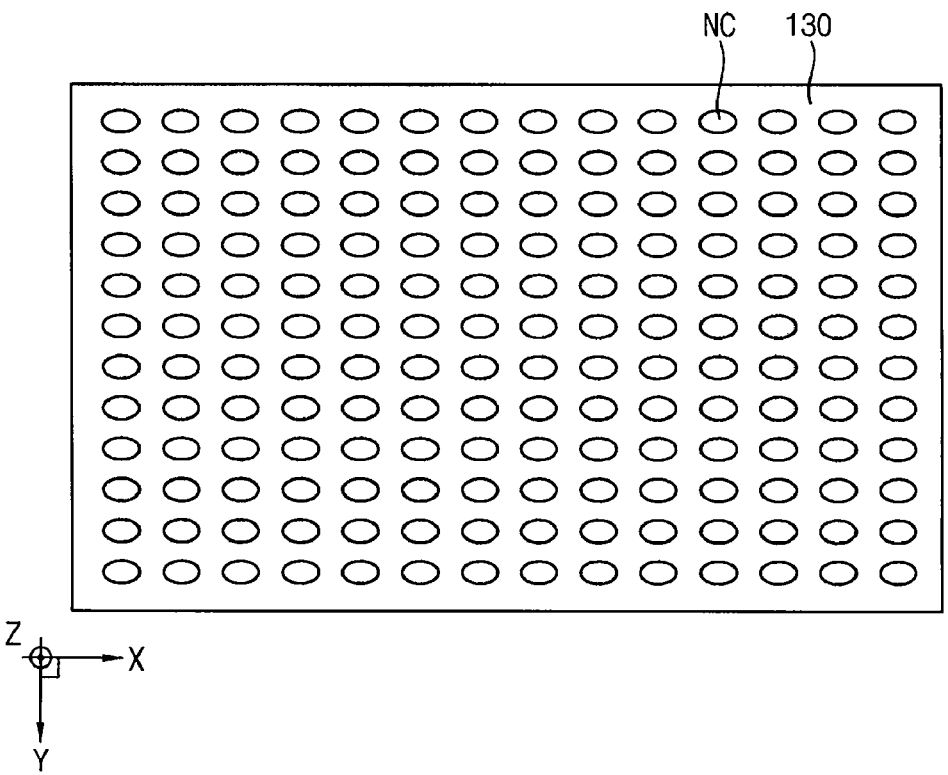
FIG. 6 is a plan view illustrating a disposing relationship of nanocrystals of FIG. 5.

FIG. 5 is a cross-sectional view schematically illustrating the TFT of FIG. 4. FIG. 6 is a plan view illustrating a disposing relationship of nanocrystals of FIG. 5.

Referring to FIGS. 4 to 6, a semiconductor pattern 154 according to this embodiment may include an active layer AL, a low band gap portion CH and an ohmic contact layer OL.

The active layer AL is formed on the gate insulation layer 130 to be overlapped with the gate electrode 152. The active layer AL may include amorphous silicon, microcrystalline silicon, etc. For one example, a thickness of the active layer AL is about 500 nm. In another example, a thickness of the active layer AL is about 50 nm to about 200 nm.

The low band gap portion CH is formed between the gate insulation layer 130 and the active layer AL. A low energy band gap of the low band gap portion CH is lower than that of the active layer AL.

The low band gap portion CH may include nanocrystals NC that are spaced apart from each other in the silicon layer. That is, the nanocrystals NC are spaced apart from each other, and amorphous silicon or microcrystalline silicon is formed between the nanocrystals NC.

For example, the nanocrystals NC may be spaced apart from each other in a plane direction that is parallel with a surface of the gate insulation layer 130 to have a shape of two-dimensional electron gas (2DEG), as shown in FIG. 5. Here, the plane direction is an X-axis direction or a Y-axis direction substantially perpendicular to the X-axis.

Each of the nanocrystals NC may include silicon (Si) and silicon germanium (SiGe). Thus, each of energy band gaps of the nanocrystals NC may have a range of about 0.9 eV to about 1.1 eV.

A size of the nanocrystals NC along the plane direction may have a range of about 5 nm to about 10 nm. Moreover, a size of the nanocrystals NC along a direction that is perpendicular to the plane direction may have a range of about 3 nm to about 5 nm. Here, the direction perpendicular to the plane direction is a Z-axis perpendicular to the X-axis and the Y-axis.

The ohmic contact layer OL is formed between the source electrode 156 and the active layer AL, and the drain electrode 158 and the active layer AL. The ohmic contact layer OL may decrease a contact resistance between the source electrode 156 and the active layer AL, and between the drain electrode 158 and the active layer AL. The ohmic contact layer OL may include, for example, high density ion injection amorphous silicon and high density ion injection microcrystalline silicon.

When a gate voltage Vg is applied to the gate electrode 152, a ground voltage is applied to the source electrode 156 and a driving voltage Vd is applied to the drain electrode 158, a channel for easily transferring electrons is formed in the low band gap portion CH. The low electrode 156 radiates electrons to provide the channel formed in the low band gap portion CH through the active layer AL. The electrons transferred to the channel move in the X-axis through the nanocrystals NC. The electrons moved along the X-axis direction are moved to the drain electrode 158 through the active layer AL.

As described above, the low band gap portion CH having a lower energy band gap than the active layer AL is formed between the gate insulation layer 130 and the active layer AL, so that electron mobility may be increased in the channel formed along the low band gap portion CH. Therefore, electrical characteristics of the TFT 150 may be enhanced.

Figure 7:
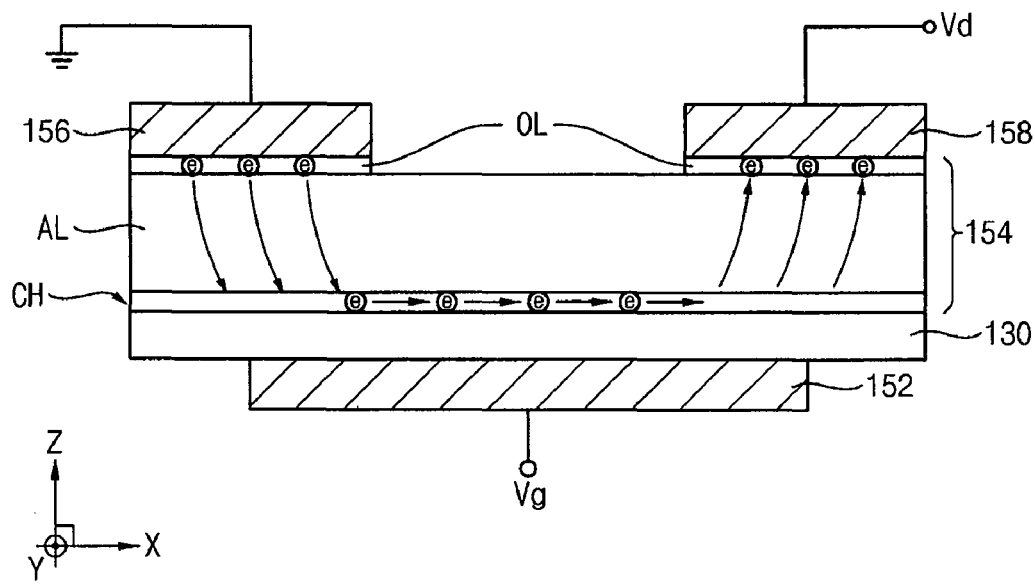
FIG. 7 is a cross-sectional view schematically illustrating a TFT having a low band gap portion of a thin-film shape different from FIG. 5.

FIG. 7 is a cross-sectional view schematically illustrating a TFT having a low band gap portion of a thin-film shape different from FIG. 5.

Referring to FIG. 7, the low band gap portion CH in accordance with this embodiment may include a low band gap layer formed on the upper surface of the gate insulation layer 130 in a thin-film shape. Here, a thickness of the low band gap layer may be about 5 nm to about 10 nm.

The low band gap layer includes silicon germanium ($Si_xGe_{1-x}$, wherein 0<x<1). Thus, an energy band gap of the low band gap layer may be about 0.9 eV to about 1.1 eV.

When the gate voltage Vg is applied to the gate electrode 152, the ground voltage is applied to the source electrode 156 and the driving voltage Vd is applied to the drain electrode 158, a channel for easily transferring electrons is formed in the low band gap layer. Here, the low band gap layer is formed on an upper surface of the gate insulation layer 130 in a thin-film shape, so that the channel formed in the low band gap layer may have a higher electron mobility than the channel formed along the nanocrystals NC as described in FIG. 5.

Figure 8:
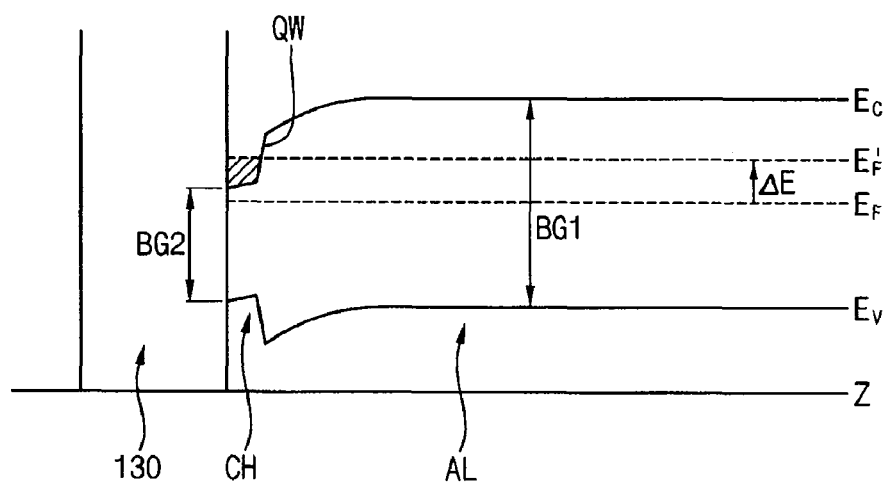
FIG. 8 is a figure illustrating a variation of an energy band gap according to the Z-axis direction in the TFT as shown in FIG. 5 or FIG. 7.

FIG. 8 is a figure illustrating a variation of an energy band gap according to the Z-axis direction in the TFT as shown in FIG. 5 or FIG. 7.

Referring to FIGS. 5, 7 and 8, a variation of an energy band gap of the semiconductor pattern 154 may be described through a valance band ($E_V$), a conduction band ($E_C$) and a Fermi energy level ($E_F$).

Here, the valance band ($E_V$) denotes an energy band that electrons are restricted, the conduction band ($E_C$) denotes an energy band that electrons are freely moved, and the energy band gap denotes a different value of an energy potential between the valance band ($E_V$) and the conduction band ($E_C$).

Moreover, the Fermi energy level ($E_F$) denotes the highest energy level of electrons in an absolute zero, that is, an energy level in which a probability that electrons are full is same as a probability that electrons are empty at a predetermined temperature.

The Fermi energy level ($E_F$) is uniform in the semiconductor pattern 154 along the Z-axis direction. Alternatively, the valence band ($E_V$) and the conduction band ($E_C$) are uniform in the semiconductor pattern 154 along the Z-axis, and are gradually decreased to be close to the gate insulation layer 130.

The active layer AL of the semiconductor pattern 154 has a first energy band gap BG1. For example, when the active layer AL includes amorphous silicon, the first energy band gap BG1 may be about 1.8 eV to about 2 eV.

The low band gap portion CH of the semiconductor pattern 154 has a second energy band gap BG2 that is lower than the first energy band gap BG1. For example, when the low band gap portion CH includes silicon germanium ($Si_xGe_{1-x}$ wherein 0<x<1), the second energy band gap BG2 may be about 0.9 eV to about 1.8 eV.

As described above, the low band gap portion CH has a second energy band gap BG2 that is lower than the first energy band gap BG1, so that a quantum well QW may be formed adjacent to the gate insulation layer 130. In this embodiment, electrons received in the quantum well QW may easily move in the X-axis direction or in the Y-axis direction, however, they may not easily move in the Z-axis direction.

When the gate voltage Vg is applied to the gate electrode 152, the ground voltage is applied to the source electrode 156 and the driving voltage Vd is applied to the drain electrode 158, the Fermi energy level ($E_F$) may be increased by a different "ΔE" between the ground voltage and the driving voltage Vd. When the Fermi energy level ($E_F$) is increased by about the different "ΔE" between the ground voltage and the driving voltage Vd, the Fermi energy level may have a higher energy potential than a bottom of the quantum well QW. Thus, electrons may be easily received in the quantum well QW.

Figure 9:
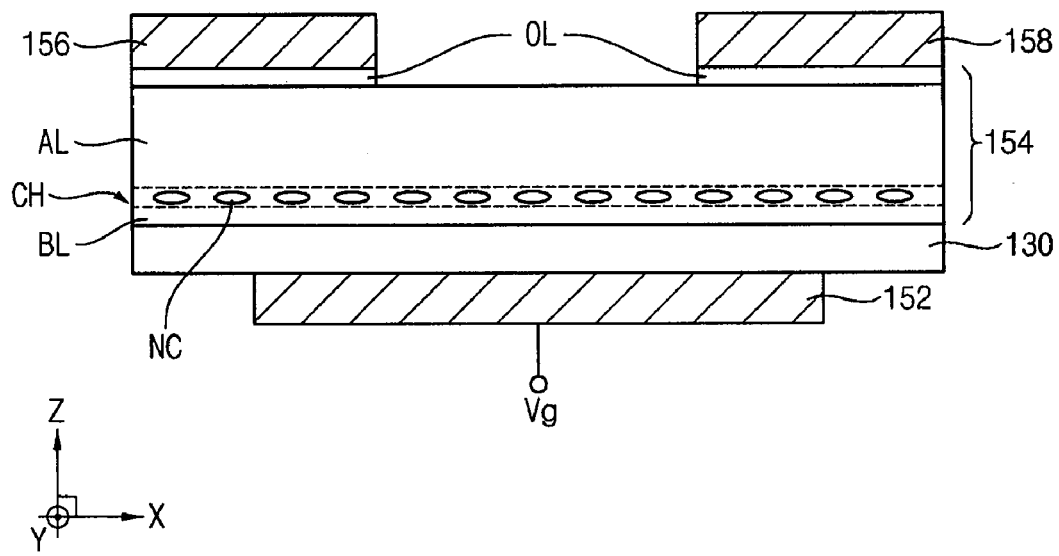
FIG. 9 is a cross-sectional view schematically illustrating a TFT further having a buffer layer formed between a gate insulation layer and a low band gap portion in FIG. 5.
Figure 10:
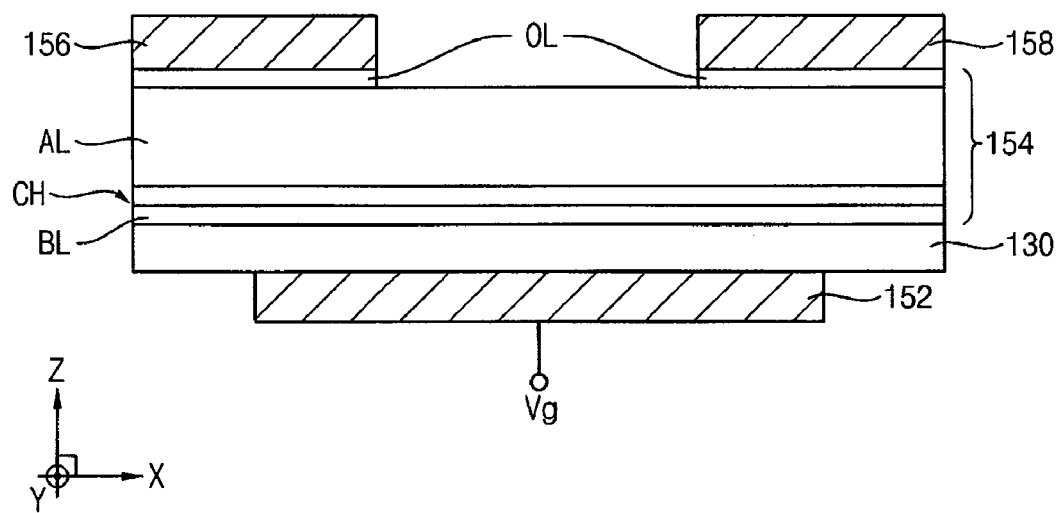
FIG. 10 is a cross-sectional view schematically illustrating a TFT having a low band gap portion of a thin-film shape different from FIG. 9.

FIG. 9 is a cross-sectional view schematically illustrating a TFT further having a buffer layer formed between a gate insulation layer and a low band gap portion in FIG. 5. FIG. 10 is a cross-sectional view schematically illustrating a TFT having a low band gap portion of a thin-film shape different from FIG. 9.

Referring to FIGS. 5, 9 and 10, the semiconductor pattern 154 according to this embodiment may further include a buffer layer BL formed between the gate insulation layer 130 and the low band gap portion CH.

The buffer layer BL is formed from a same material of the active layer AL. For example, the buffer layer BL may include amorphous silicon and microcrystalline silicon. The buffer layer BL may perform a role of a site for generating a seed that forms a crystalline of the nanocrystals NC or a layer of a thin-film shape.

For example, when the buffer layer BL includes a material of a silicon-series that is the same as the low band gap portion CH, the low band gap portion CH and the buffer layer BL may have a homo structure formed through a junction of the same kind of materials.

On the other hand, when the buffer layer BL is not as shown in FIG. 5 or 7, the low band gap portion CH and the buffer layer BL may have a hetero structure formed through a junction of different kind of materials.

Generally, the hetero structure may include manifold atoms that are existed in a dangling bond status in compared with the homo structure, so that the homo structure is electrically more stable than the hetero structure.

A thickness of an effective channel may have a range of about 20 nm to about 40 nm. Thus, when a thickness of the channel formed in the semiconductor pattern is lower than that of the effective channel, a channel formed in the semiconductor pattern may be open.

Therefore, a thickness of the buffer layer BL may have a range of about 3 nm to about 10 nm. For example, when a thickness of the buffer layer BL is no more than about 3 nm, it is difficult to form the buffer layer BL in a thin-film shape. When a thickness of the buffer layer BL is no less than about 10 nm, the quantum well QW is formed in an area of no more than about 20 nm. That is, when the buffer layer BL is increased greatly, it is difficult to form the channel in the low band gap portion CH.

Figure 11:
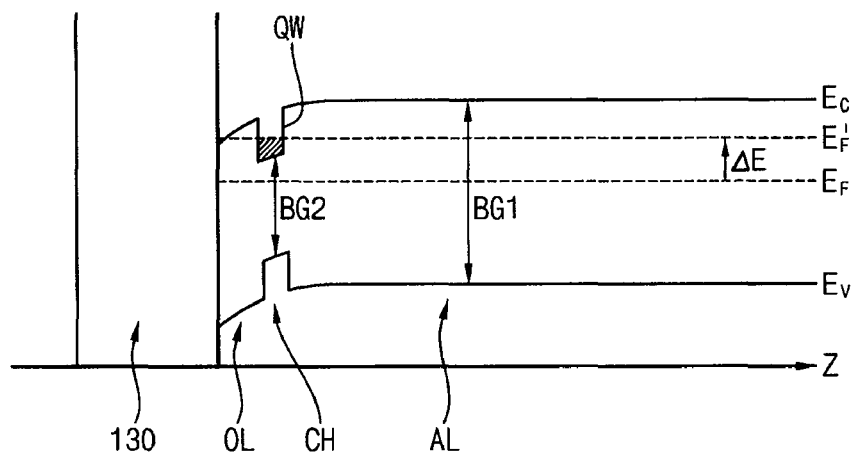
FIG. 11 is a figure illustrating a variation of an energy band gap according to the Z-axis direction in the TFT as shown in FIG. 9 or FIG. 10.

FIG. 11 illustrates a variation of an energy band gap according to the Z-axis direction in the TFT as shown in FIG. 9 or FIG. 10.

Referring to FIGS. 9 to 11, the Fermi energy level ($E_F$) is constantly uniform along the Z-axis direction in the semiconductor pattern 154 in accordance with this embodiment. On the other hand, the valance band ($E_V$) and the conduction band EC are uniform along the Z-axis direction in the semiconductor pattern 154, and are gradually decreased to be close to the gate insulation layer 130.

The active layer AL of the semiconductor pattern 154 has a first energy band gap BG1. For example, when the active layer AL includes amorphous silicon, the first energy band gap BG1 may be about 1.8 eV to about 2 eV.

The low band gap portion CH of the semiconductor pattern 154 has a second energy band gap BG2 that is lower than the first energy band gap BG1. For example, when the low band gap portion CH includes a silicon germanium ($Si_xGe_{1-x}$, wherein 0<x<1), the second energy band gap BG2 may be about 0.9 eV to about 1.8 eV.

The buffer layer BL of the semiconductor pattern 154 and the active layer AL are formed from the same material, so that the buffer layer BL may have the first energy band gap BG1.

As described above, the low band gap portion CH has a second energy band gap BG2 that is lower than the first energy band gap BG1, so that a quantum well QW may be formed between the buffer layer BL and the active layer AL.

When the gate voltage Vg is applied to the gate electrode 152, the ground voltage is applied to the source electrode 156 and the driving voltage Vd is applied to the drain electrode 158, the Fermi energy level ($E_F$) may be increased by a different "ΔE" between the ground voltage and the driving voltage Vd. Thus, an energy level of the Fermi energy level ($E_F$) is higher than that of a bottom of the quantum well QW, so that electrons may be easily received in the quantum well QW.

Figure 12:
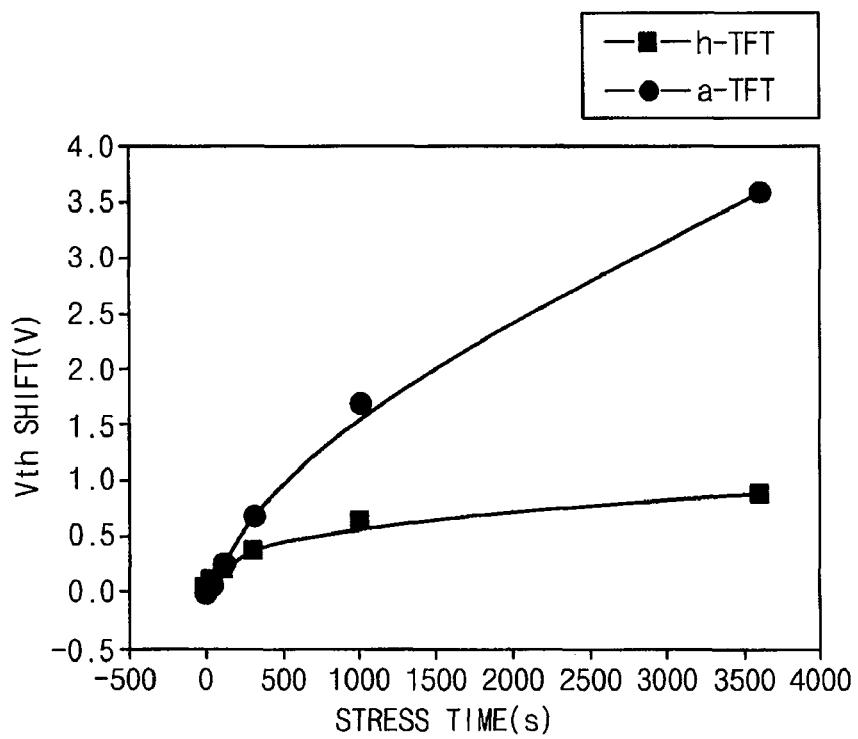
FIG. 12 is a graph showing characteristics of the TFT in accordance with the present embodiment.

FIG. 12 is a graph showing characteristics of the TFT in accordance with the present embodiment.

Referring to FIG. 12, electrical characteristics of a hybrid thin-film transistor (referred to as an "h-TFT") and an amorphous thin-film transistor (referred to as an "a-TFT") will be described. In the graph, the gate voltage Vg is about 20 V, the driving voltage Vd is about 0.1 V, and a temperature is about 60° C.

Here, the h-TFT denotes that the TFT 150 according to this embodiment, which has the low band gap portion CH in the semiconductor pattern 154, and the a-TFT denotes that a conventional TFT without the low band gap portion CH in the semiconductor pattern 154.

In FIG. 12, a threshold voltage Vth of the a-TFT increases when a stress time is rapidly increased. That is, the a-TFT is deteriorated in accordance with a time, and electrical characteristics of the amorphous TFT (a-TFT) may be varied. On the other hand, a threshold voltage Vth of the h-TFT is uniform even though a stress time is increased. That is, the h-TFT is not deteriorated even though a time is increased, so that electrical characteristics of the h-TFT may be stable. Here, the threshold voltage Vth denotes a voltage required for causing a turning-on or turning-off of the TFT.

Hereinafter, a method of manufacturing the TFT 150 according to this embodiment will be described.

Referring to FIGS. 4 to 6, the gate electrode 152 is formed on the base substrate 110 disposed in a processing chamber (not shown), and then the gate insulation layer 130 is formed on the gate electrode 152. Here, an atmospheric pressure of the processing chamber may be about $2 \times 10^{-6}$ T.

Then, the low band gap portion CH is formed on the gate insulation layer 130. The low band gap portion CH may include silicon (Si) and a silicon germanium ($Si_xGe_{1-x}$, wherein 0<x<1).

For example, a silane ($SiH_4$) gas and germane ($GeH_4$) gas may be supplied to the processing chamber to form the low band gap portion CH. In additional, hydrogen gas and argon gas may be supplied to the processing chamber.

For example, a temperature of the processing chamber is about 250° C., a supplying amount of the silane ($SiH_4$) gas is about 15 standard cubic centimeter per minutes (sccm), and a supplying amount of the germane ($GeH_4$) gas is about 30 sccm. A supplying amount of the hydrogen gas is about 800 sccm, and a supplying amount of the argon gas is about 600 sccm. Moreover, a pressure of the compressing chamber may be about 2000 mT when the silane ($SiH_4$) gas and the germane ($GeH_4$) gas are supplied to the chamber, and a plasma power applied to the processing chamber may be about 100 W to about 300 W. That is, the plasma power by a unit size of the processing chamber may be about 0.2 W/cm² to about 0.6 W/cm². For example, the plasma power of the processing chamber is about 150 W. That is, the poser power by a unit size of the processing chamber may be about 0.3 W/cm².

The ratio of silicon content and germanium content in the silicon germanium (SiGe) is set by the ratio of an amount of the silane ($SiH_4$) gas and the germane ($GeH_4$) gas. Generally, when the germanium amount is increased, an energy band gap of the silicon germanium (SiGe) may be gradually decreased.

For example, when a deposition time of the silane ($SiH_4$) gas and the germane ($GeH_4$) is relatively short, a growth time of the silicon germanium (SiGe) is relatively short so that the nanocrystals NC may be spaced apart from each other on the gate insulation layer 130. A size of the nanocrystal NC corresponding to the plane direction may be about 5 nm to about 10 nm, and a size of the nanocrystal NC corresponding to a vertical direction perpendicular to the plane direction may be about 3 nm to about 5 nm.

Here, when the size of the nanocrystal NC corresponding to the plane direction is no more than about 5 nm or the size of the nanocrystal NC corresponding to a vertical direction perpendicular to the plane direction is no more than about 3 nm, a crystallization of the nanocrystal NC is not formed or an ordering of the crystallization is decreased so that crystal characteristics of the nanocrystal NC may be decreased. However, when the size of the nanocrystal NC corresponding to the plane direction is no less than about 5 nm or the size of the nanocrystal NC corresponding to a vertical direction perpendicular to the plane direction is no less than about 3 nm, a layer of a thin-film shape not the nanocrystal NC may be formed on the gate insulation 130.

Furthermore, when a deposition time of the silane ($SiH_4$) gas and the germane ($GeH_4$) is relatively long, a growth time of the silicon germanium (SiGe) is relatively long so that the low band gap layer of a thin-film shape may be formed on the gate insulation layer 130. For example, a thickness of the low band gap layer may be about 5 nm to about 10 nm. That is, when a crystallization of the silicon germanium has a thickness of about 5 nm to about 10 nm, a layer of a thin-film shape may be formed on the gate insulation layer 130. However, when a thickness of the low band gap layer is no less than about 10 nm, the low band gap layer may have an inefficiently and excessively thicker thickness.

The active layer AL having a higher energy band gap than the low band gap portion CH is formed on the low band gap portion CH, and then the ohmic contact layer OL is formed on the active layer AL.

Then, the ohmic contact layer OL, the active layer AL and the low band gap portion CH are patterned to form the semiconductor pattern 154.

Then, a metal layer is formed on the gate insulation layer 130 to cover the semiconductor pattern 154, and then the metal layer is patterned to form the source electrode 156 and the drain electrode 158. The source electrode 156 and the drain electrode 158 are spaced apart from each other to be overlapped with a portion of the semiconductor pattern.

Then, a portion of the ohmic contact layer OL is etched using the source electrode 156 and the drain electrode 158 as a mask.

In a method of manufacturing the TFT 150 according to this embodiment, the buffer layer BL formed from the same material as the active layer AL may be formed on the gate insulation layer 130 before the low band gap portion CH is formed. Here, a thickness of the buffer layer BL may be about 3 nm to about 10 nm.

Moreover, in a method of manufacturing the TFT 150 according to this embodiment, the ohmic contact layer OL, the active layer AL and the low band gap portion CH are patterned, the metal layer is formed, and then the metal layer is patterned. Alternatively, the metal layer is formed, and then the ohmic contact layer OL, the active layer AL and the low band gap portion CH are patterned when the metal layer is patterned. As a result, the number of masks for manufacturing the TFT 150 may be decreased.

According to the present invention, a low band gap portion having a lower energy band gap than the active layer is formed between the gate insulation layer and the active layer, so that electron mobility may be increased in the channel formed along the low band gap portion. Moreover, a driving time of the TFT is increased, so that a deterioration of the TFT may be prevented. That is, electrical characteristics of the TFT may be enhanced.

Figure 13:
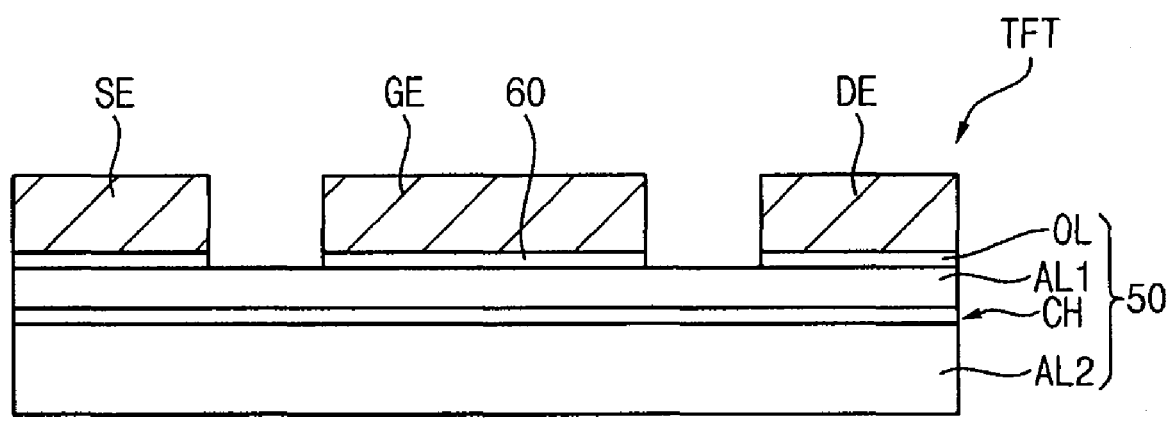
FIG. 13 is a cross-sectional view schematically illustrating the TFT of a display device according to another embodiment of the present invention.

FIG. 13 is a cross-sectional view schematically illustrating the TFT of a display device according to another embodiment of the present invention.

Referring to FIG. 13, a TFT according to this embodiment is a top gate type TFT that is different from the top gate type TFT that is described above.

The TFT includes a semiconductor pattern 50, a source electrode SE, a drain electrode DE and a gate electrode GE.

The source electrode SE is formed on a first surface of the semiconductor pattern 50. The drain electrode DE is spaced apart from the source electrode SE on the first surface of the semiconductor pattern 50.

The gate electrode GE is spaced apart from the source electrode SE and the drain electrode DE on the first surface of the semiconductor pattern 50. The gate electrode GE is disposed between the source electrode SE and the drain electrode DE. A gate insulation layer 60 may be further formed between the gate electrode GE and the semiconductor pattern 50.

The semiconductor pattern 50 may include a first active layer AL1, a second active layer AL2 and a low band gap portion CH. The low band gap portion CH may be formed between the first and second active layers AL1 and AL2. Here, a thickness of the first active layer AL1 may be thinner than that of the second active layer AL2 so that the low band gap portion CH is adjacent to the source electrode SE, the drain electrode DE and the gate electrode GE.

The first and second active layers AL1 and AL2 are formed from the same material such as amorphous silicon and microcrystalline silicon. The low band gap portion CH may have a lower energy band gap than the first and second active layers AL1 and AL2.

For one example, the low band gap portion CH may include nanocrystals spaced apart from each other. For another example, the low band gap portion CH may include a low band gap layer formed in a thin-film shape. The low band gap portion CH may include silicon (Si) and a silicon germanium (SiGe).

The semiconductor pattern 50 may further include an ohmic contact layer OL that is formed between the first active layer AL1 and the source electrode SE, and the second active layer AL2 and the drain electrode DE.

When a gate voltage is applied to the gate electrode GE, a ground voltage is applied to the source electrode SE and a driving voltage Vd is applied to the drain electrode DE, a channel having a relatively high electron mobility may be formed along the low band gap portion CH.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A thin-film transistor (TFT) comprising:
a gate electrode;
a semiconductor pattern comprising an active layer being overlapped with the gate electrode and a low band gap portion having a lower energy band gap than the active layer, wherein the low band gap portion comprises a plurality of nanocrystals; and
a source electrode and a drain electrode being spaced apart from each other to be overlapped with the semiconductor pattern.

2. The TFT of claim 1, further comprising a gate insulation layer formed between the gate electrode and the low band gap portion.

3. The TFT of claim 2, wherein the active layer comprises amorphous silicon or microcrystalline silicon.

4. The TFT of claim 3, wherein the nanocrystals are spaced apart from each other between the gate insulation layer and the active layer.

5. The TFT of claim 4, wherein the nanocrystals comprises silicon or a silicon germanium (SixGe1-x, wherein 0<x<1).

6. The TFT of claim 4, wherein the nanocrystals are spaced apart from each other in a plane direction that is parallel with a surface of the gate insulation layer to have a shape of two-dimensional electron gas.

7. The TFT of claim 4, wherein an energy band gap of the low band gap portion is about 0.9 eV to about 1.8 eV.

8. The TFT of claim 3, wherein the low band gap portion comprises a low band gap layer formed between the gate insulation layer and the active layer in a thin-film shape.

9. The TFT of claim 8, wherein the low band gap layer comprises a silicon germanium (SixGe1-x, wherein 0<x<1).

10. The TFT of claim 8, wherein an energy band gap of the low band gap layer is about 0.9 eV to about 1.8 eV.

11. The TFT of claim 3, wherein the semiconductor pattern further comprises a buffer layer between the gate insulation layer and the low band gap portion, wherein the buffer layer and the active layer are formed from a same material.

12. The TFT of claim 3, wherein the semiconductor pattern further comprises an ohmic contact layer formed between the source electrode and the active layer, and between the drain electrode and the active layer.

13. A method of manufacturing a thin-film transistor (TFT), the method comprising:
forming a gate electrode;
forming a semiconductor pattern comprising an active layer being overlapped with the gate electrode and a low band gap portion having a lower energy band gap than the active layer, wherein forming the low band gap portion further comprises depositing silicon or germanium to form a plurality of nanocrystals; and
forming a source electrode and a drain electrode that are spaced apart from each other to be overlapped with the semiconductor pattern.

14. The method of claim 13, further comprising forming a gate insulation layer between the gate electrode and the low band gap portion.

15. The method of claim 14, further comprising forming a buffer layer between the gate insulation layer and the low band gap portion, wherein the buffer layer and the active layer are formed from a same material.

16. The method of claim 14, wherein forming the semiconductor pattern comprises:
forming the low band gap portion on the gate insulation layer; and
forming the active layer on the low band gap portion.

17. The method of claim 16, wherein the forming the low band gap portion further comprises depositing the silicon or germanium on the gate insulation layer to form the plurality of nanocrystals spaced apart from each other.

18. The method of claim 16, wherein forming the low band gap portion comprises depositing silicon or germanium on the gate insulation layer to form a low band gap layer of a thin-film shape.

19. A thin-film transistor (TFT) substrate comprising:
a base substrate;
a plurality of TFTs comprising:
a gate electrode;
a semiconductor pattern comprising an active layer being overlapped with the gate electrode and a low band gap portion having a low energy band gap than the active layer, wherein the low band gap portion comprises a plurality of nanocrystals; and
a source electrode and a drain electrode that are spaced apart from each other to be overlapped with the semiconductor pattern;
a passivation layer covering the TFT to protect the TFT; and
a plurality of pixel electrodes formed on the passivation layer to be electrically connected to the TFT through a plurality of contact holes of the passivation layer.

20. The TFT substrate of claim 19, wherein a portion of the TFTs is formed in a display area of the base substrate to be electrically connected to the pixel electrodes, respectively, and
another portion of the TFT is formed in a peripheral area of the base substrate to control the TFT formed in the display area.

21. A display device comprising:
a thin-film transistor (TFT) substrate;
an opposite substrate opposite to the TFT substrate; and
a liquid crystal layer disposed between the TFT substrate and the opposite substrate, wherein the TFT substrate comprises:
a base substrate;
a plurality of TFTs comprising a gate electrode, a semiconductor pattern comprising an active layer being overlapped with the gate electrode and a low band gap portion having a low energy band gap than the active layer, and a source electrode and a drain electrode that are spaced apart from each other to be overlapped with the semiconductor pattern;
a passivation layer covering the TFT to protect the TFT; and
a plurality of pixel electrodes formed on the passivation layer to be electrically connected to the TFT through a plurality of contact holes of the passivation layer;
wherein the low band gap portion comprises a plurality of nanocrystals.

* * * * *